United States Patent
Song et al.

(10) Patent No.: US 7,421,643 B2
(45) Date of Patent: Sep. 2, 2008

(54) DATA DETECTION AND DECODING SYSTEM AND A METHOD OF DETECTING AND DECODING DATA

(75) Inventors: Hongwei Song, Boulder, CO (US); German Feyh, Boulder, CO (US)

(73) Assignee: Agere Systems Inc., Allentown, PA (US)

( * ) Notice: Subject to any disclaimer, the term of this patent is extended or adjusted under 35 U.S.C. 154(b) by 515 days.

(21) Appl. No.: 11/029,148

(22) Filed: Jan. 4, 2005

(65) Prior Publication Data

US 2006/0150065 A1    Jul. 6, 2006

(51) Int. Cl.
*H03M 13/00* (2006.01)
(52) U.S. Cl. .................................... 714/794
(58) Field of Classification Search ............ 714/794
See application file for complete search history.

(56) References Cited

U.S. PATENT DOCUMENTS

| | | | | |
|---|---|---|---|---|
| 5,457,704 A * | 10/1995 | Hoeher et al. | ............... | 714/794 |
| 5,729,560 A * | 3/1998 | Hagenauer et al. | .......... | 714/786 |
| 6,161,209 A * | 12/2000 | Moher | ......................... | 714/780 |
| 6,662,338 B1 * | 12/2003 | Rezzi et al. | .................. | 714/795 |
| 7,251,770 B2 * | 7/2007 | Bottomley et al. | .......... | 714/755 |
| 2002/0147954 A1 * | 10/2002 | Shea | .......................... | 714/755 |
| 2005/0204256 A1 * | 9/2005 | Yeh et al. | ..................... | 714/755 |
| 2006/0168493 A1 * | 7/2006 | Song | .......................... | 714/752 |

* cited by examiner

*Primary Examiner*—Jacques Louis-Jacques
*Assistant Examiner*—Sam Rizk (57) ABSTRACT

A data detection and decoding system in which a single parity bit added to the end of each code word by the encoder is used in the channel detector to improve the accuracy with which bit decisions are made in the channel detector. The bit estimates and the reliability estimates are then processed by the decoder to recover the original input bits. By using single parity for this dual purpose in combination with a decoder that follows the channel detector and uses the bit estimates and reliability estimates to recover the original input bits, performance of the data detection and decoding system is greatly improved while also overcoming the disadvantages of known digital recording systems.

14 Claims, 7 Drawing Sheets

DATA DETECTION AND DECODING SYSTEM AND A METHOD OF DETECTING AND DECODING DATA

TECHNICAL FIELD OF THE INVENTION

The invention relates to detecting and decoding digital information. More particularly, the invention relates to a system that includes a channel detector that uses the parity bits used to encode the data to detect data with greater accuracy. The channel detector produces both a hard and a soft output, which are received and used by a decoder to recover the original digital information. The use of the parity bits in the soft-output channel detector in combination with the interaction between the channel detector and the decoder provide the system with improved performance compared to known data detection and decoding systems.

BACKGROUND OF THE INVENTION

Digital communications systems and digital storage systems (e.g., hard disk drives) are similar from the perspective of extracting the original (transmitted or stored) bits from the received signal or from the readback signal. In the case of communications channels, the digital information is transferred from one location to another location, but at the same time (perhaps with a small transmission delay), whereas in storage channels, the information is transferred from one time to a later time, but at the same location. The goal in both cases is to retrieve the original bits as accurately as possible in the presence of impairments such as noise and inter-symbol interference (ISI).

One method for improving the accuracy of the retrieved digital information involves using error correcting codes (ECCs). ECCs typically use parity bits to introduce redundancy into the signal prior to transmission or storage. Such redundancy is subsequently used to decode the encoded information. In order to demonstrate the typical manner in which parity bits are currently used for this purpose, an example of a known digital storage system and its operations will be described with reference to FIGS. 1-5.

Figure 1:
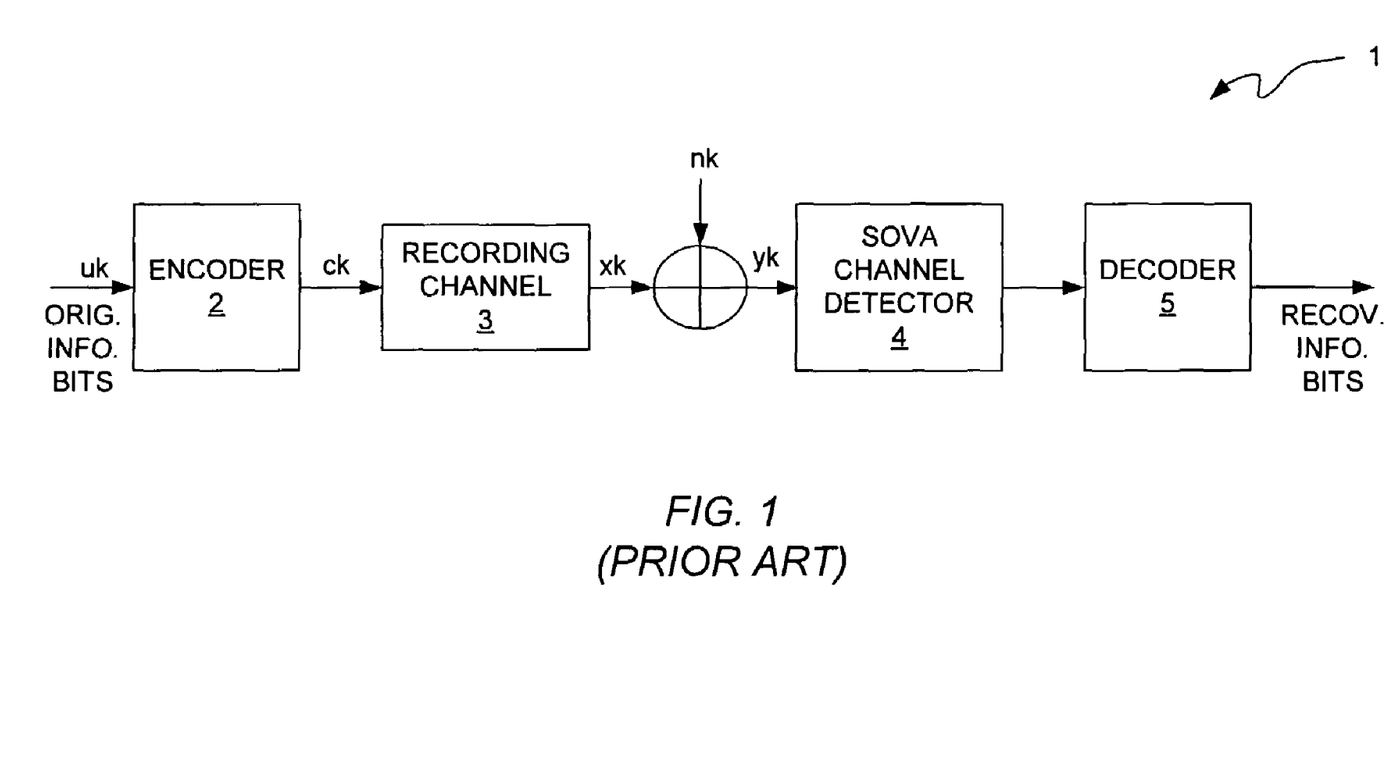
FIG. 1 illustrates a block diagram of a known digital recording system that includes a known SOVA channel detector.

FIG. 1 illustrates a block diagram of a known digital storage system 1 that uses parity bits to encode information prior to storing the information. The digital storage system 1 includes an encoder 2 that encodes information bits by pseudo-randomly interleaving parity bits throughout the information bits. The encoder 2 is typically a two-dimensional product code (TPC) encoder. The encoded information bits are subsequently read out of the recording channel 3. The recording channel 3 typically includes physical and electrical components (not shown), such as the read/write head, the read/write head armature, the recording media, the pre-amplifier, etc.

As encoded information bits are read out of the recording channel 3, they are processed by a channel detector 4 that performs an algorithm to detect bits. The detector 4 is typically a hard Viterbi detector that produces hard decisions (i.e., a decision that a bit is either a 1 or a 0) or a soft-output Viterbi algorithm (SOVA) detector that produces hard decisions and reliability estimates (i.e., respective estimates as to the reliability of the respective hard decisions). The output of the channel detector 4 is received by a channel decoder 5 that deinterleaves the parity bits and decodes the bit sequence.

Figure 2A:
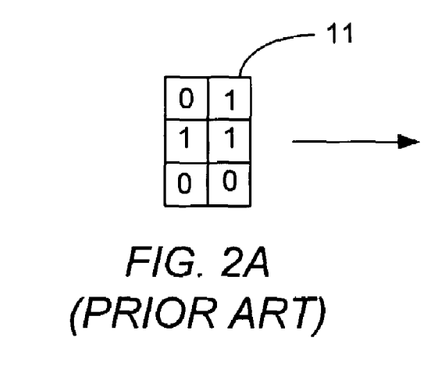
FIG. 2A illustrates a 3×2 table containing original information bits before parity bits have been inserted.
Figure 2B:
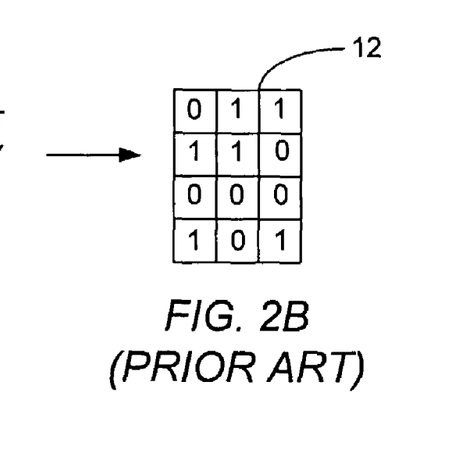
FIG. 2B illustrates a 4×3 table containing original information bits and parity bits.

For this example, it will be assumed that a particular sequence of original information bits, uk=010110, is to be stored in the recording channel 3. This particular sequence is represented by the 3×2 table 11 shown in FIG. 2A. The sequence is encoded by the encoder 2 to produce a codeword. Assuming that the encoder 2 is a two-dimensional product (TPC) encoder, a parity bit is added to each row and to each column of the 3×2 table 11 to produce an even parity code (i.e., each column and each row contains an even number of 1's). The resulting 4×3 table 12 is shown in FIG. 2B. For this example, it will be assumed that each column in the 4×3 table 12 corresponds to a single parity codeword. However, this is not normally the case. As stated above, the parity bits are typically pseudo-randomly interleaved throughout the original information bits. For ease of explanation, the parity bits are shown as simply added to each row and column of table 11 in such a way that each 4-bit column of table 12 is provided with even parity.

The resulting codeword ck=010111001001 is recorded in the recording channel 3. The signal xk read from the recording channel 3 is typically corrupted by noise, nk, such as additive Gaussian noise, for example, which produces samples yk that are received by the channel detector 4. The channel detector 4, which will be assumed to be a SOVA detector for this example, receives the samples yk and produces hard decisions and corresponding soft reliability estimates. This information is then processed by the decoder 5 to produce the recovered information bits.

Figure 3:
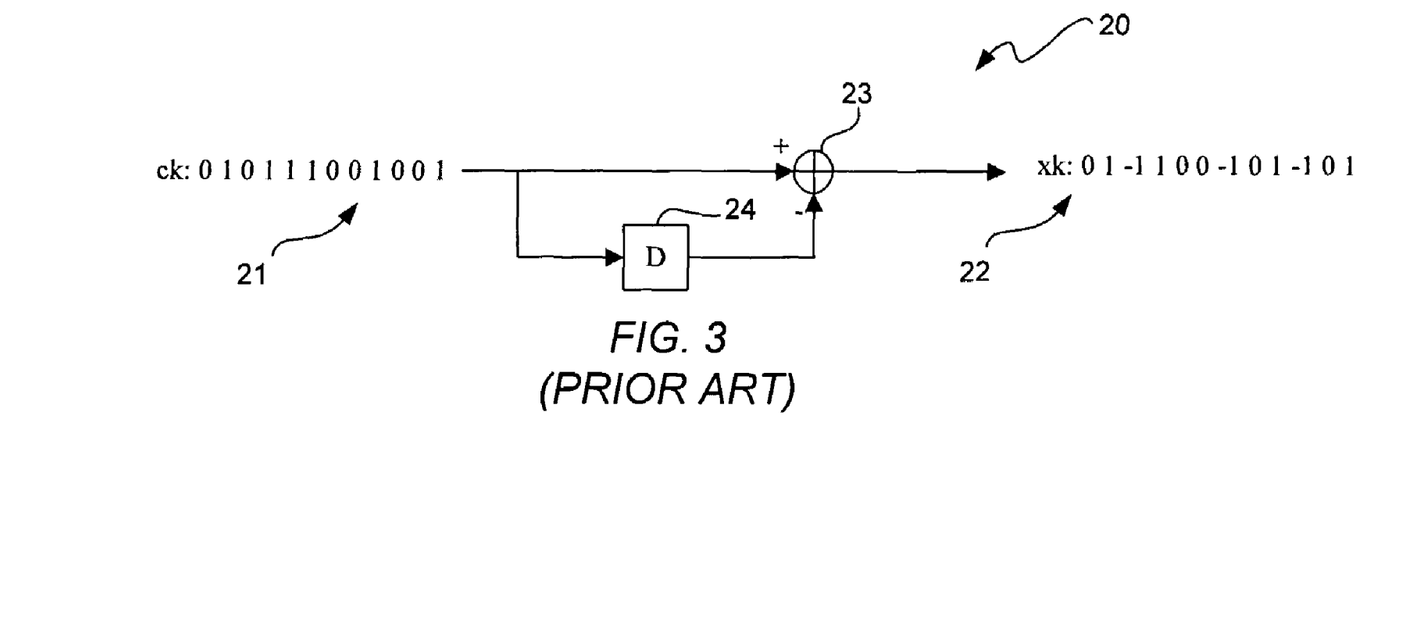
FIG. 3 illustrates a block diagram of a model of a one-delay (1-D) element recording channel used to model the recording channel shown in FIG. 1.

The recording channel 3 may be modeled as a very simple partial response one-delay (1-D) element channel, as shown in FIG. 3. The recording channel 3 modeled as a 1-D element channel 20 has an input 21, an output 22, a summer 23 and a delay element 24. The summer 23 sums the bit stored in the delay element 24 with the current bit in the ck sequence to produce a current bit in the output sequence xk.

Figure 4:
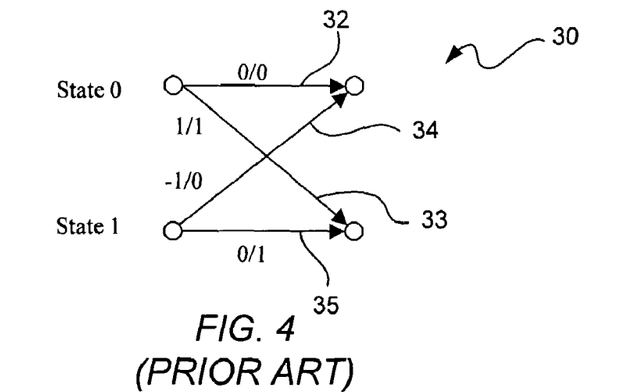
FIG. 4 illustrates a state trellis diagram for the 1-D recording channel model shown in FIG. 3.

FIG. 4 illustrates a state trellis diagram 30 for the 1-D element channel 20 shown in FIG. 3. The channel model 20 has two states, namely, state 0 and state 1. The channel states depend on the bit stored in the delay element 24. The initial state of the delay element 24 is presumed to be zero. Each of the transition branches 32-35 in the trellis diagram 30 is associated with one input bit and one output bit. For example, "0/1" corresponds to an input bit 1 and an output bit 0. If the state of the delay element 24 is 0 at time k−1 and the channel input bit is 0 at time k−1, then the channel output bit at time k−1 is 0 (i.e., 0+0). Branch 32 of the trellis diagram 30 represents this 0/0 output/input. If the channel input bit at time k−1 is 1 and the state of the delay element 24 is 0 at time k−1, then the channel output bit at time k−1 is 1 (i.e., 1-0). Branch 33 of the trellis diagram 30 represents this 1/1 output/input. If the state of delay element 24 at time k−1 is 1 and the channel input at time k−1 is 0, then the channel output at time k−1 is 0. Branch 34 of the trellis diagram 30 represents this −1/0 output/input. If the state of delay element 24 at time k−1 is 1 and the channel input at time k−1 is 1, then the channel output at time k−1 is 0. Branch 35 of the trellis diagram 30 represents this 0/1 output/input.

Figure 5:
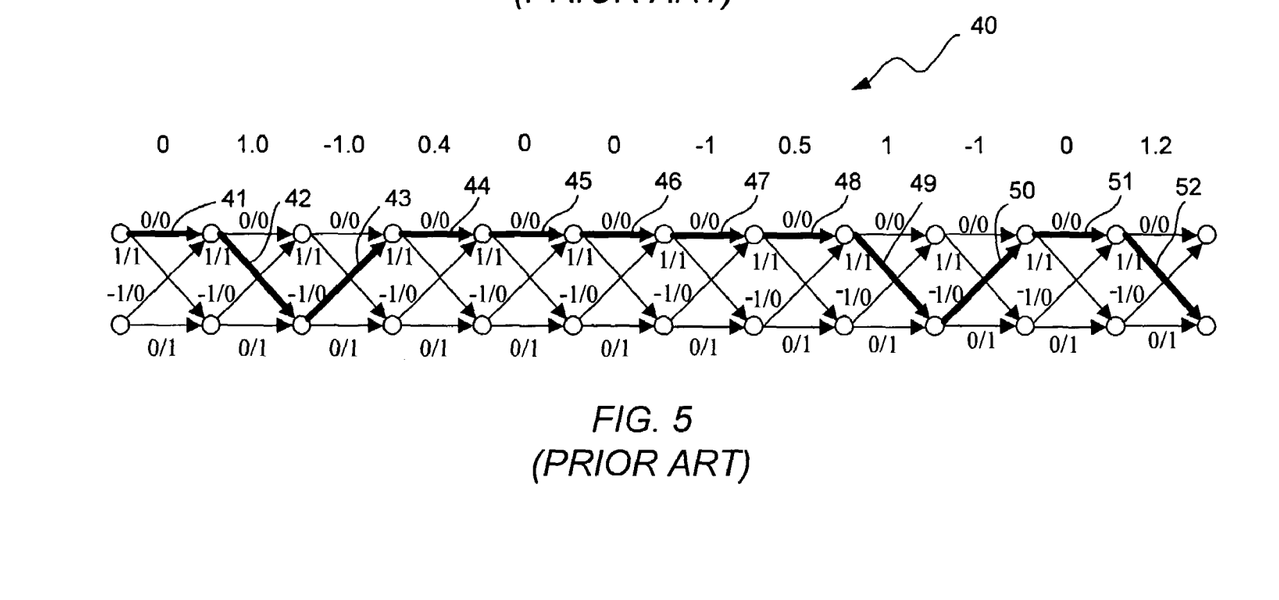
FIG. 5 illustrates a Viterbi trellis diagram for the 1-D recording channel model shown in FIG. 3.

FIG. 5 illustrates the 1-D trellis diagram 40 corresponding to the ideal channel output, xk=01−1100−101−101, for the channel input, ck=010111001001, for times k=0 through k=11 for the entire 12-bit sequence shown in FIG. 3. The sequences ck, xk, nk, and yk for this example are listed below in Table 1.

TABLE 1

Sequence values

| | k | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| ck | 0 | 1 | 0 | 1 | 1 | 1 | 0 | 0 | 1 | 0 | 0 | 1 |
| xk | 0 | 1 | −1 | 1 | 0 | 0 | −1 | 0 | 1 | −1 | 0 | 1 |
| nk | 0 | 0 | 0 | −0.6 | 0 | 0 | 0 | 0.5 | 0 | 0 | 0 | 0.2 |
| yk | 0 | 1 | −1 | 0.4 | 0 | 0 | −1 | 0.5 | 1 | −1 | 0 | 1.2 |

The SOVA detector 4 determines the maximum likelihood (ML) path that has the minimum distance to the received sequence yk. Assuming the initial state of the delay element is 0, the ML path is made up of branches 41-52 of the trellis 40 shown in FIG. 5. As is well know in the art, the ML path is chosen by selecting the branches that have ideal inputs that are closest to the values of the corresponding yk samples. For example, for yk=0 at time k=0, the chosen branch is the 0/0 branch labeled 41. For yk=1 at time k=1, the chosen branch is the 1/1 branch labeled 42. For yk=−1 at time k=2, the chosen branch is the −1/0 branch labeled 43.

By continuing to perform this algorithm for times k=3 through k=11, the SOVA detector 4 generates an estimated input bit sequence of 010000001001 for times k=1 through k=11. A comparison of this sequence with the original input sequence ck shown in Table 1 shows that the bit decisions made by the SOVA detector 4 for times k=3, k=4 and k=5 do not have the same values as the bits of the ck sequence for those same times. Therefore, although the SOVA detector 4 is reasonably accurate at detecting bits, there is room for improvement.

Aside from the need to improve data detection accuracy, the configuration described above with reference to FIG. 1 has certain disadvantages. As stated above, the parity bits are typically inserted by the encoder 2 via a pseudo-random bit interleaving process. This process is intended to improve the performance of the system. However, it is possible for the interleaved bit sequence to violate certain modulation constraints imposed by the modulation encoder (not shown), which may further reduce data detection accuracy. Furthermore, the system generally requires an interleaver following the encoder 2 and a de-interleaver following the detector 4, and thus requires additional hardware. In addition, memory buffers are needed in the encoder 2 and in the decoder 5 to store the interleaved and de-interleaved bit sequences, respectively, which presents further difficulties in terms of hardware requirements.

Figure 6:
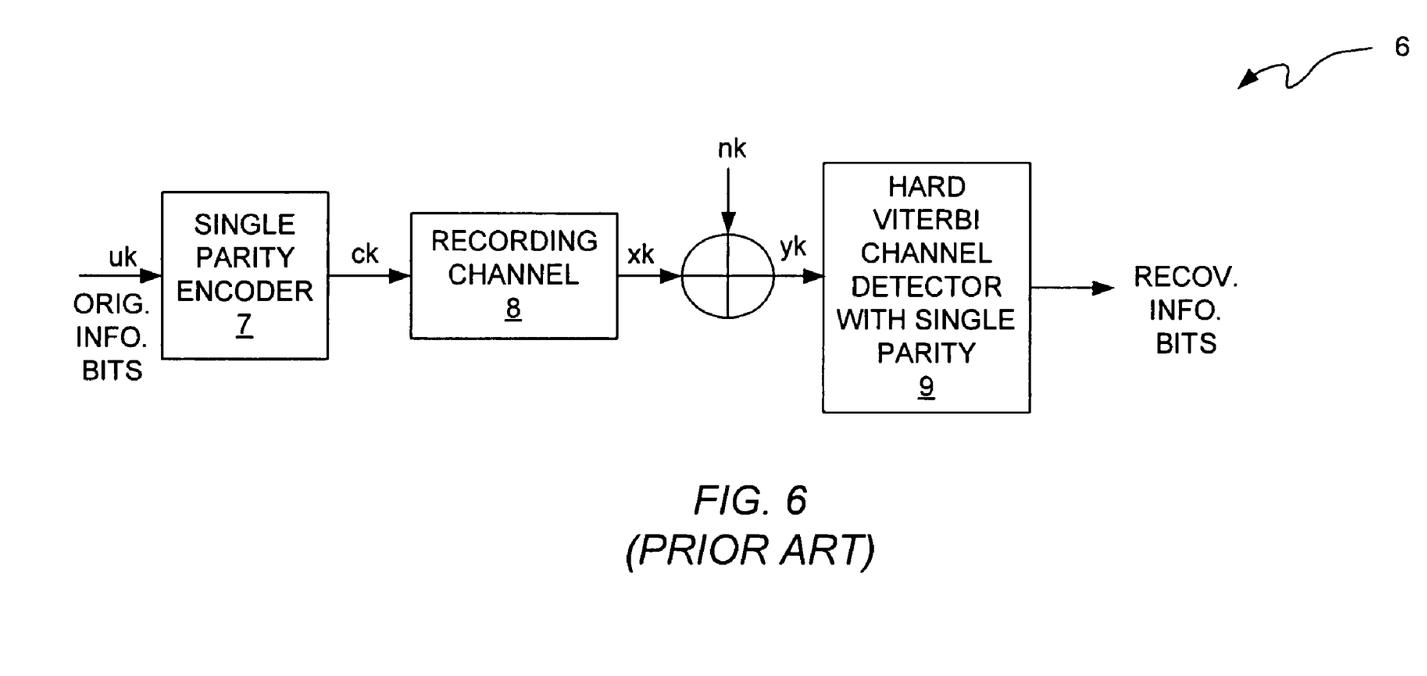
FIG. 6 illustrates a block diagram of a known digital recording system that has a single parity encoder and a single parity hard Viterbi detector.

Another known digital recording system, which is shown in FIG. 6, includes a single parity encoder 7, a read channel 8 and a hard Viterbi detector 9 that uses single parity. This system 6 does not include a decoder because a decoder is not necessary. The Viterbi detector with single parity detects and decodes the data. Adding a decoder would not provide any improvement in performance. However, performance of the system 6 is limited by its use of single parity because the use of single parity in the system 6 does not provide sufficient protection against errors. For this reason, the system 1 shown in FIG. 1 has been proposed because the use of interleaved parity bits in two-dimensions provides sufficient protection against errors, although the system 1 has the aforementioned other disadvantages.

Accordingly, a need exists for a data detection and decoding system that detects bits with improved accuracy. A need also exists for a data detection and decoding system that eliminates the need to interleave the parity bits in the encoder and de-interleave the parity bits in the decoder, while still providing improved performance over existing data detection and decoding systems.

SUMMARY OF THE INVENTION

The invention provides a data detection and decoding system having a channel detector that uses parity bits to improve bit detection accuracy and which produces both a hard and a soft output. A decoder of the system uses the hard and soft output to recover the original information bits.

The channel detector comprises bit estimation logic configured to estimate whether each bit of a code word received in the channel detector is a 1 or a 0, decision logic configured to decide whether one or more of the bit estimates is correct based on one or more parity bits contained in the code word, and reliability generation logic configured to produce respective reliability estimates associated with the respective bit estimates.

The invention also provides a method for detecting data comprising estimating whether each bit of a code word received in the channel detector is a 1 or a 0, deciding whether one or more of the estimates is correct based on one or more parity bits contained in the code word, and producing respective reliability estimates associated with the respective bit estimates.

These and other features of the invention will become apparent from the following description, drawings and claims.

DETAILED DESCRIPTION OF THE PREFERRED EMBODIMENT

In accordance with the invention, it has been determined that if a suitable code is chosen to encode the original information bits, a single parity bit can be added to the end of each code word by the encoder and used in the channel detector to improve the accuracy with which bit decisions are made in the channel detector. The decoder and channel detector then cooperate to iteratively process the bits to detect and decode the bits with extremely high accuracy. The same parity bits that the encoder uses to encode the original bits are used by the channel detector to produce bit estimates and reliability estimates. The bit estimates and the reliability estimates are then processed by the decoder to recover the original input bits. By using single parity for this dual purpose in combination with a decoder that follows the channel detector and uses the bit estimates and reliability estimates to recover the original input bits, performance of the digital recording system is greatly improved while also overcoming the disadvantages described above with reference to the known systems shown in FIGS. 1 and 6.

Figure 7:
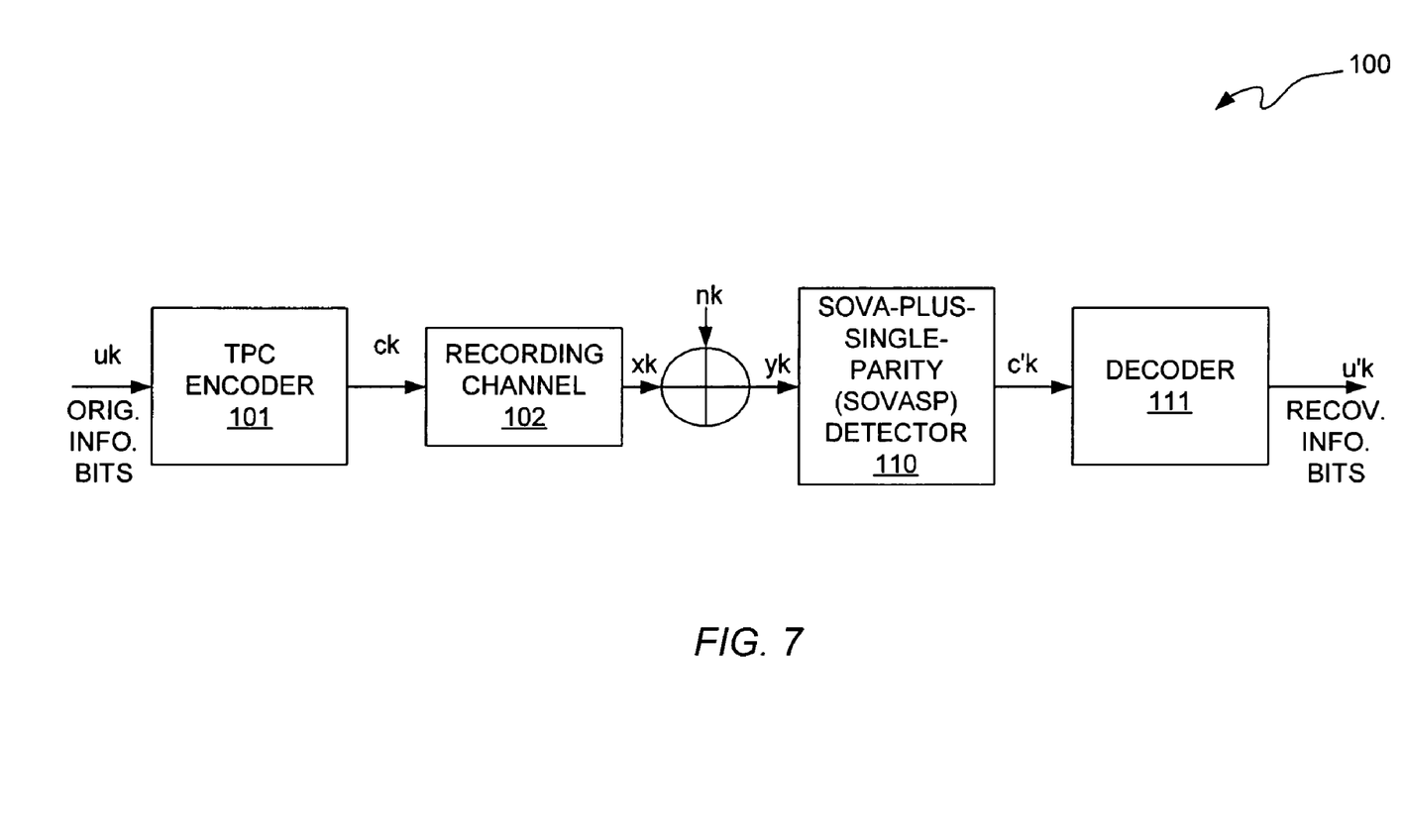
FIG. 7 illustrates a block diagram of the digital recording system of the invention in accordance with the preferred embodiment, which includes a SOVA plus single parity (SOVASP) channel detector.

FIG. 7 illustrates a block diagram of the digital recording system 100 of the present invention in accordance with an exemplary embodiment. In accordance with this embodiment, a TPC encoder 101 is used to encode the original information bits with single parity. For purposes of providing an example of the manner in which the digital recording system 100 operates, it will be assumed that even parity is used, that each TPC code word is 4 bits in length, and that the bits are read out of the recording channel on a column-by-column basis.

The 4×3 table 12 shown in FIG. 2B will be used in this example to represent TPC encoded data, as each 4-bit column in the table 12 has even parity, which satisfies single parity. However, this is merely for ease of discussion because, unlike the known system 1 shown in FIG. 1, in accordance with the invention, the parity bits are not interleaved with the original information bits. Rather, in accordance with the invention, a single parity bit may be added to each column and/or to each row such that each code word bit sequence read back from the read channel is guaranteed to have the correct parity. Regardless of the manner in which the parity bits are added, the encoding ensures that the parity bits are added in such a way that when the bit sequences are read back from the read channel, each code word bit sequence will satisfy the required parity. Thus, unlike the known digital recording system 1 described above with reference to FIG. 1, there is no need to have memory buffers in the encoder and decoder of the system of the invention for storing the interleaved and de-interleaved pseudo-random bit sequences. This feature of the invention reduces the complexity of the hardware needed in the encoder and decoder while still providing improved performance. In addition, this feature of the invention eliminates the potential for problems associated with the aforementioned modulation constraints.

The recording channel 102 and the decoder 111 shown in FIG. 7 may be identical to the recording channel 3 and decoder 5, respectively, shown in FIG. 1. Therefore, in the interest of brevity, a description of the recording channel 102 and the decoder 111 shown in FIG. 7 will not be provided. An example of the data detection algorithm performed by the SOVASP detector 110 of the invention will now be provided with reference to FIGS. 8 and 9. In addition, the 1-D channel model 20 described above with reference to FIG. 3 and the values shown in Table 1 will also be used in this example.

Figure 8:
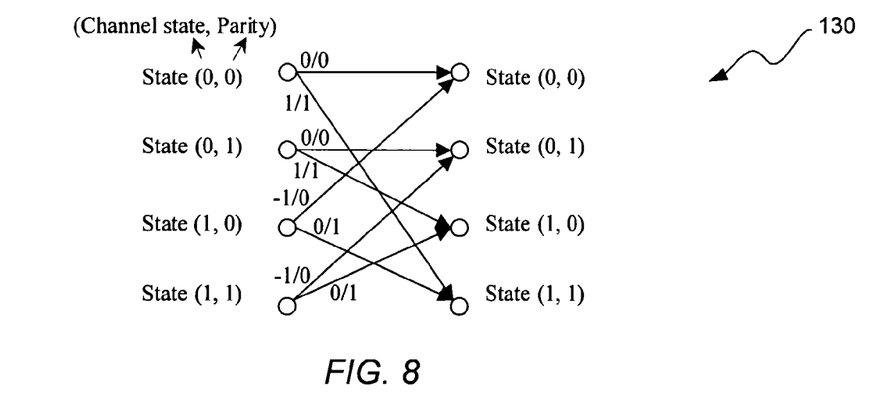
FIG. 8 illustrates a state trellis diagram for the SOVASP detector shown in FIG. 7.

FIG. 8 illustrates a state trellis diagram 130 for the 1-D channel 20 shown in FIG. 3 when single parity is used. The first bit in the parenthetical is the channel state and the second bit in the parenthetical is the parity bit. When the parity bit is used, four states exist instead of the two states shown in FIG. 4. These four states will be referred to herein as states S0, S1, S2 and S3.

Figure 9:
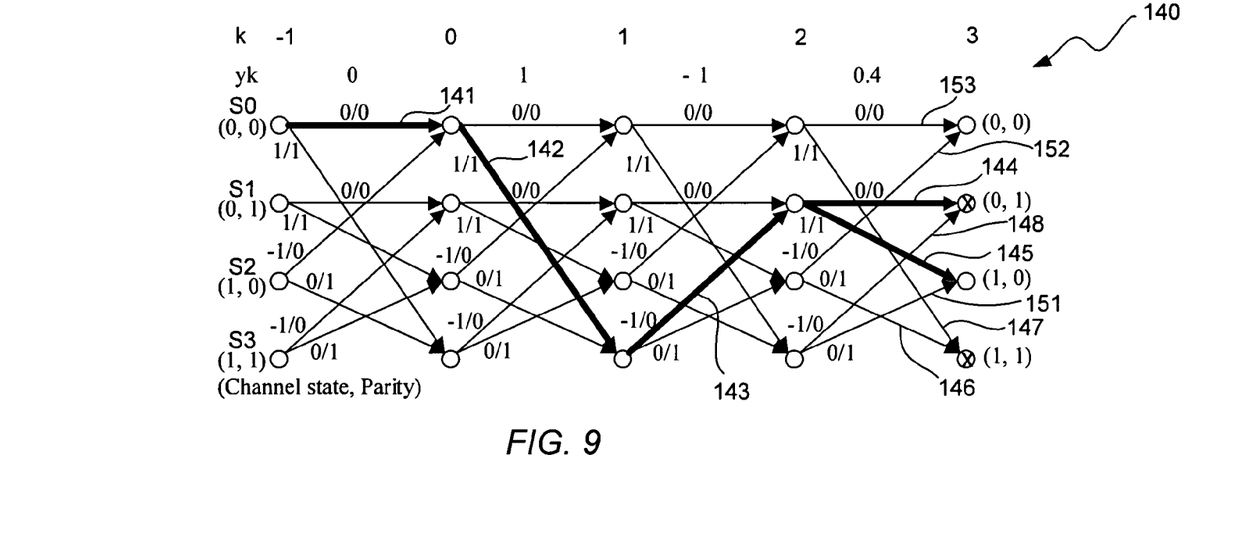
FIG. 9 illustrates a Viterbi trellis diagram for the SOVASP channel detector shown in FIG. 7.

FIG. 9 illustrates a Viterbi trellis diagram 140 for the SOVA detector 110 of the invention, which is based on the state trellis diagram 130 shown in FIG. 8. The Viterbi trellis diagram 140 shown in FIG. 9 covers one single parity codeword, which is 4 bits in length in this example. The k and yk values from Table 1 are shown listed across the top of the Viterbi trellis diagram 140 for times k=−1 through k=3. The ML path, which corresponds to branches 141-144 of the Viterbi trellis diagram 140, which are bolded in FIG. 9, is determined in the same manner described above with reference to FIG. 5. If parity were not used to prune the trellis 140, as is the case with the known SOVA channel detector described above with reference to FIG. 1, the branch 144 would be chosen as the surviving branch at the single parity (SP) code word boundary (i.e., at the end of the 4-bit codeword boundary). This is because yk=0.4 is closer to the ideal input of 0 than it is to the ideal input of 1. This choice would result in a decision that the original input bit at time k=3 is 0. As can be seen from Table 1, this decision would be incorrect because the original input bit at time k=3 is 1.

In accordance with the invention, single parity is used to determine that the surviving branch after branch 143 is not branch 144, but is branch 145. As shown in the trellis diagram 140, the accumulated parity at time k=3 for state S1 is P=1, which violates even parity. Therefore, branch 145 is chosen instead of branch 144. Any branch leading to state S1 at time k=3 is then be pruned. Likewise, the accumulated parity at time k=3 for state S3 is P=1, which violates even parity. Therefore, any branch leading to state S3 at time k=3 is also pruned. The result is that, at the SP code word boundary, which is at the end of each 4-bit code word in this example, half of the branches are pruned. For example, in this case, branches 144, 146, 147 and 148 are pruned. The surviving branches are branches 145, 151, 152 and 153.

Therefore, the channel detector of the invention makes bit decisions with much greater accuracy than known channel detectors. In addition, the channel detector 110 of the invention provides improved performance in that it enables the trellis to be pruned more quickly than with known channel detectors.

It can be seen from the foregoing that the channel detector 110 estimates whether a bit is a 1 or a 0 by using the SOVA algorithm and then uses one or more parity bits to make a decision as to whether the bit estimate was correct. The SOVASP channel detector 110 generates reliability estimates at each time for each state based on the difference between the surviving branch and the pruned branch. The channel detector 110 will typically be implemented in an integrated circuit (IC) that is configured to execute the SOVASP algorithm of the invention. Thus, the channel detector 110 can be viewed as having estimation logic configured to estimate whether a bit is a 1 or a 0, decision logic configured to use one or more parity bits to decide whether the estimation is correct, and reliability estimation logic configured to produce respective reliability estimates for the respective bit decisions.

It should be noted that the SP code words will typically be much longer than 4 bits in length. A 4-bit SP code word is used in the example provided above to simplify the description of the invention and for ease of illustration. Also, the example given above assumes that bit sequences are read from the read channel on a column-by-column basis. It should also be noted that the example given above applies equally to cases in which the bit sequences are read from the read channel row by row, diagonally, or in any other manner, provided that each code word bit sequence read back from the read channel and received in the SOVASP channel detector 110 has the required parity (i.e., even or odd).

The reliability estimates are calculated in the normal manner in which a known SOVA detector makes such calculations, which is well known in the art. Therefore, the reliability estimate calculations will not be described here in detail. As indicated above, generally the reliability estimates are calculated by obtaining the difference between each surviving branch and the corresponding pruned branch. The hard bit decisions and the reliability estimates are then used by the decoder 111 to recover the original information bits. As stated above, the decoder 111 may be a known decoder configured to receive hard bit decisions and reliability estimates and to use this information to recover the original input bits. Decoders that are configured to operate with known SOVA channel detectors are suitable for this purpose.

Figure 10:
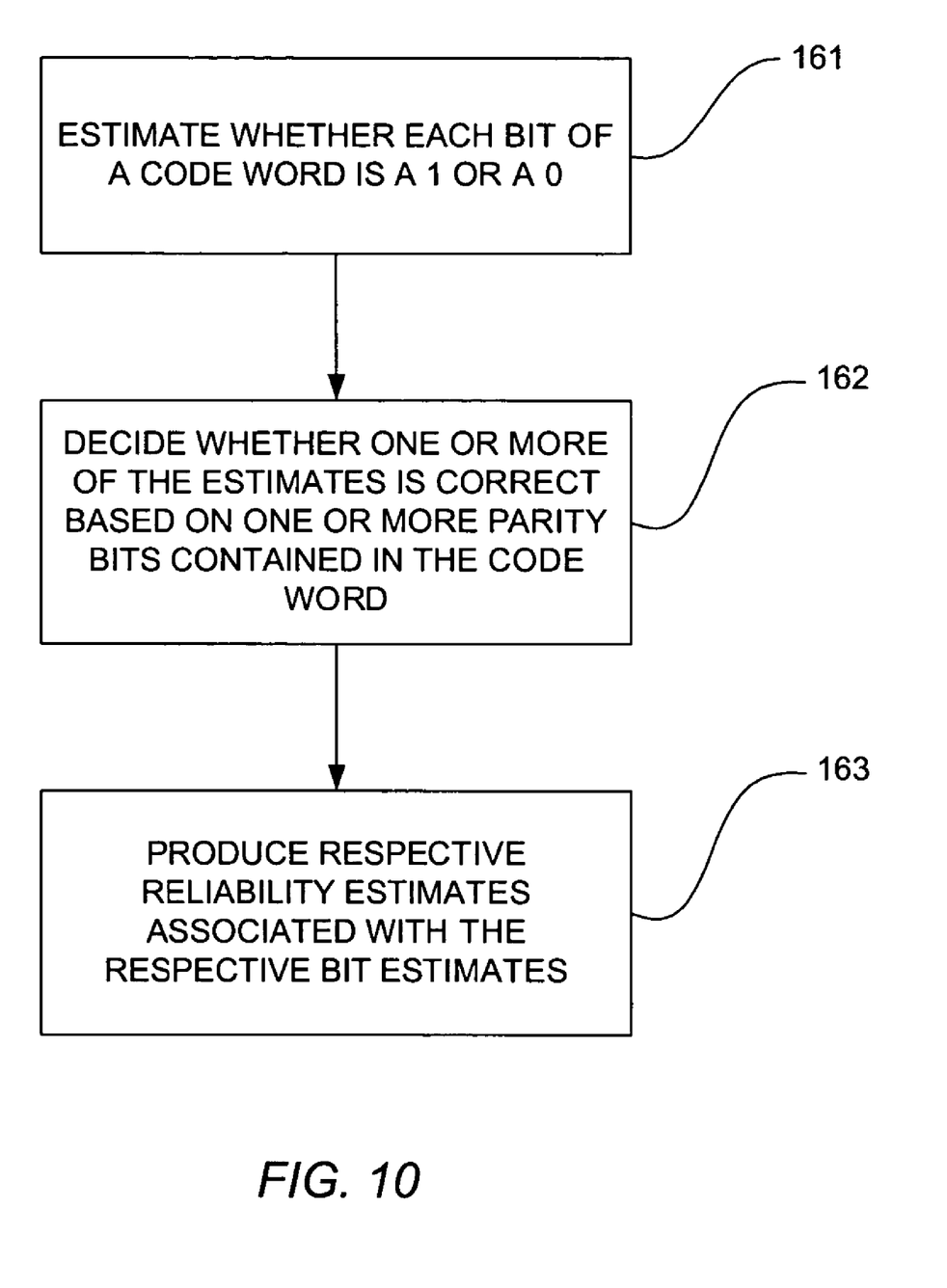
FIG. 10 illustrates a flow chart corresponding to the method of the invention in accordance with the preferred embodiment for detecting data with a channel detector that uses parity.

FIG. 10 illustrates a flow chart demonstrating the method of the invention in accordance with the preferred embodiment. The method comprises estimating whether each bit of a code word received in the channel detector is a 1 or a 0, as indicated by block 161, deciding whether one or more of the estimates is correct based on one or more parity bits contained in the code word, as indicated by block 162, and producing respective reliability estimates associated with respective bit decisions, as indicated by block 163. The bit estimates and the reliability estimates are subsequently used by the decoder 111 to decode the data and recover the original information bits.

It should be noted that the invention has been described with reference to particular exemplary and preferred embodiments and that the invention is not limited to the embodiments described herein. Those skilled in the art will understand, in view of the description provided herein, the manner in which modifications may be made to the embodiments described herein without deviating from the scope of the invention.

What is claimed is:

1. A channel detector comprising:
   estimation logic configured to estimate whether each bit of a code word received in the channel detector is a 1 or a 0, wherein the estimation logic estimates whether each of the bits of the code word is a 1 or a 0 by determining a maximum likelihood (ML) path through a Viterbi trellis and determining respective bit values associated with respective branches along the ML path, wherein the respective bit values associated with the respective branches along the ML path correspond to respective estimates;
   decision logic configured to decide whether one or more of the estimates is correct based on one or more parity bits contained in the code word, wherein the decision logic is configured to prune branches in the Viterbi trellis based on the one or more parity bits to reduce the number of possible branches through the Viterbi trellis from which to determine the maximum likelihood path; and
   reliability generation logic configured to produce respective reliability estimates associated with the respective bit estimates, wherein the bit estimates and the reliability estimates are used by a decoder in an iterative process between the channel detector and the decoder to recover original information bits of the code word.

2. The channel detector of claim 1, wherein the code word contains a single parity bit.

3. The channel detector of claim 1, wherein the decision logic decides whether one or more of the estimates are correct by determining whether the code word has odd parity or even parity, wherein if the decision logic determines that the code word has even parity, the decision logic decides that one or more of the estimates are correct.

4. The channel detector of claim 3, wherein if the decision logic determines that the code word has odd parity, the decision logic decides that at least one of the estimates is incorrect.

5. The channel detector of claim 1, wherein the decision logic decides whether one or more of the estimates are correct by determining whether the code word has odd parity or even parity, wherein if the decision logic determines that the code word has odd parity, the decision logic decides that one or more of the estimates are correct.

6. The channel detector of claim 5, wherein if the decision determines that the code word has even parity, the decision logic decides that at least one of the estimates is incorrect.

7. An apparatus for detecting and decoding data comprising:
   a channel detector comprising:
      estimation logic configured to estimate whether each bit of a code word received in the channel detector is a 1 or a 0, wherein the estimation logic estimates whether each of the bits of the code word is a 1 or a 0 by determining a maximum likelihood (ML) path through a Viterbi trellis and determining respective bit values associated with respective branches along the ML path, wherein the respective bit values associated with the respective branches along the ML path correspond to respective estimates;
      decision logic configured to decide whether one or more of the estimates is correct based on one or more parity bits contained in the code word, wherein the decision logic is configured to prune branches in the Viterbi trellis based on the one or more parity bits to reduce the number of possible branches through the Viterbi trellis from which to determine the maximum likelihood path; and
      reliability generation logic configured to produce respective reliability estimates associated with the respective bit estimates; and
   a decoder configured to receive bit estimates and reliability estimates from the channel detector and to recover original information bits using the bit estimates and the reliability estimates, wherein the decoder cooperates with the channel detector to iteratively process the bits of the code word to recover the original information bits using the bit estimates and the reliability estimates.

8. method for detecting data comprising:
   estimating whether each bit of a code word received in the channel detector is a 1 or a 0 by determining a maximum likelihood (ML) path through a Viterbi trellis and determining respective bit values associated with respective branches along the ML path, wherein the respective bit values associated with the respective branches along the ML path correspond to respective estimates;
   deciding whether one or more of the estimates is correct based on one or more parity bits contained in the code word, wherein the deciding step includes pruning branches in the Viterbi trellis based on the one or more parity bits to reduce the number of possible branches through the Viterbi trellis from which to determine the maximum likelihood path; and
   producing respective reliability estimates associated with the respective bit estimates,
   wherein the estimating step, the deciding step and the producing step are used in an iterative process to recover original information bits of the code word.

9. The method of claim 8, wherein the code word contains a single parity bit.

10. The method of claim 8, wherein the deciding step includes determining whether the code word has odd parity or even parity, wherein if a determination is made that the code word has even parity, a decision is made that one or more of the estimates are correct.

11. The method of claim 10, wherein if a determination is made that the code word has odd parity, the decision logic decides that at least one of the estimates is incorrect.

12. The method of claim 8, wherein the deciding step includes determining whether the code word has odd parity or even parity, wherein if a determination is made that the code word has odd parity, a decision is made that one or more of the estimates are correct.

13. The method of claim 12, wherein if a determination is made that the code word has even parity, a decision is made that at least one of the estimates is incorrect.

14. A method for detecting and decoding data comprising:
estimating whether each bit of a code word received in the channel detector is a 1 or a 0 by determining a maximum likelihood (ML) path through a Viterbi trellis and determining respective bit values associated with respective branches along the ML path, wherein the respective bit values associated with the respective branches along the ML path correspond to respective estimates;
deciding whether one or more of the estimates is correct based on one or more parity bits contained in the code word, wherein the deciding step includes pruning branches in the Viterbi trellis based on the one or more parity bits to reduce the number of possible branches through the Viterbi trellis from which to determine the maximum likelihood path;
producing respective reliability estimates associated with the respective bit estimates; and
iteratively processing the respective bit estimates and respective reliability estimates to recover original information bits of the code word.

* * * * *